United States Patent
Hsu et al.

(10) Patent No.: US 7,397,261 B2
(45) Date of Patent: Jul. 8, 2008

(54) MONITORING SYSTEM FOR DETECTING AND CHARACTERIZING CLASSES OF LEAKAGE IN CMOS DEVICES

(75) Inventors: Louis Lu-Chen Hsu, Fishkill, NY (US); Edward R. Pillai, Wappingers Falls, NY (US); Joseph Natonio, Wappingers Falls, NY (US); James D. Rockrohr, Hopewell Junction, NY (US); David R. Hanson, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 231 days.

(21) Appl. No.: 11/380,515

(22) Filed: Apr. 27, 2006

(65) Prior Publication Data

US 2007/0252613 A1 Nov. 1, 2007

(51) Int. Cl.
*G01R 31/26* (2006.01)
(52) U.S. Cl. .................. 324/763; 324/769; 324/765
(58) Field of Classification Search ............. None
See application file for complete search history.

(56) References Cited

U.S. PATENT DOCUMENTS

| | | | |
|---|---|---|---|
| 5,818,268 A | 10/1998 | Kim et al. | |
| 6,350,636 B1 | 2/2002 | Lee et al. | |
| 6,714,473 B1 | 3/2004 | Fiscus | |
| 6,844,750 B2 | 1/2005 | Hsu et al. | |
| 6,844,771 B1 | 1/2005 | Chen | |
| 7,035,131 B2 * | 4/2006 | Huang et al. | 365/149 |
| 7,196,571 B2 * | 3/2007 | Sumita | 327/534 |
| 7,235,997 B2 * | 6/2007 | Huang | 324/769 |

OTHER PUBLICATIONS

C.R. Crowell and S.M. Sze, "Current Transport in Metal-Semiconductor Barriers", Solid State Electron , 1966, vol. 9, pp. 1035-1048.
Masakazu Shimaya, "New Screening Concept for Deep submicron CMOS VLSIs using Temperature Characteristics of Leakage Currents in MOS Devices", IEEE, 1997, pp. 49-56.

* cited by examiner

*Primary Examiner*—Vinh P Nguyen
(74) *Attorney, Agent, or Firm*—H. Daniel Schurmann

(57) ABSTRACT

A universal leakage monitoring system (ULMS) to measure a plurality of leakage macros during the development of a manufacturing process or a normal operation period. The ULMS characterizes the leakage of both n-type and p-type CMOS devices on the gate dielectric leakage, the sub-threshold leakage, and the reverse biased junction leakage, and the like. Testing is performed sequentially from the first test macro up to the last test macro using an on-chip algorithm. When the last test macro is tested, it scans the leakage data out.

18 Claims, 11 Drawing Sheets

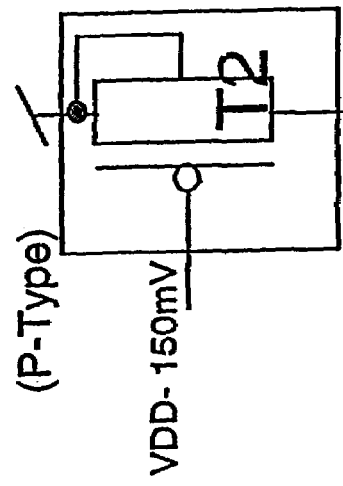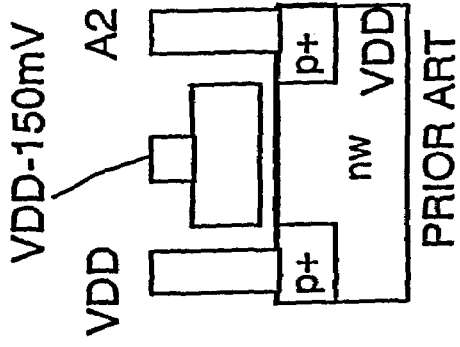
FIG-3A PRIOR ART
FIG-4A PRIOR ART
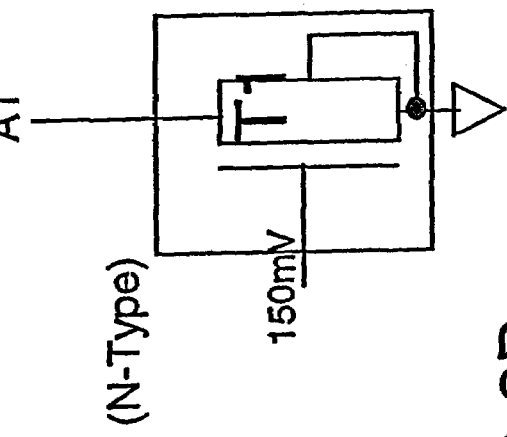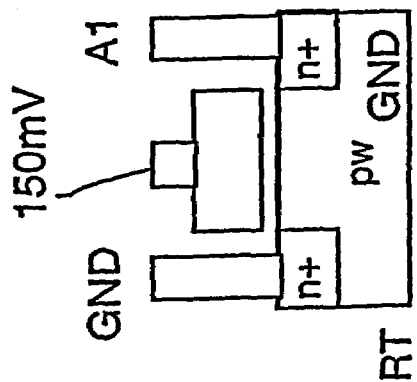
FIG-3B PRIOR ART
FIG-4B PRIOR ART

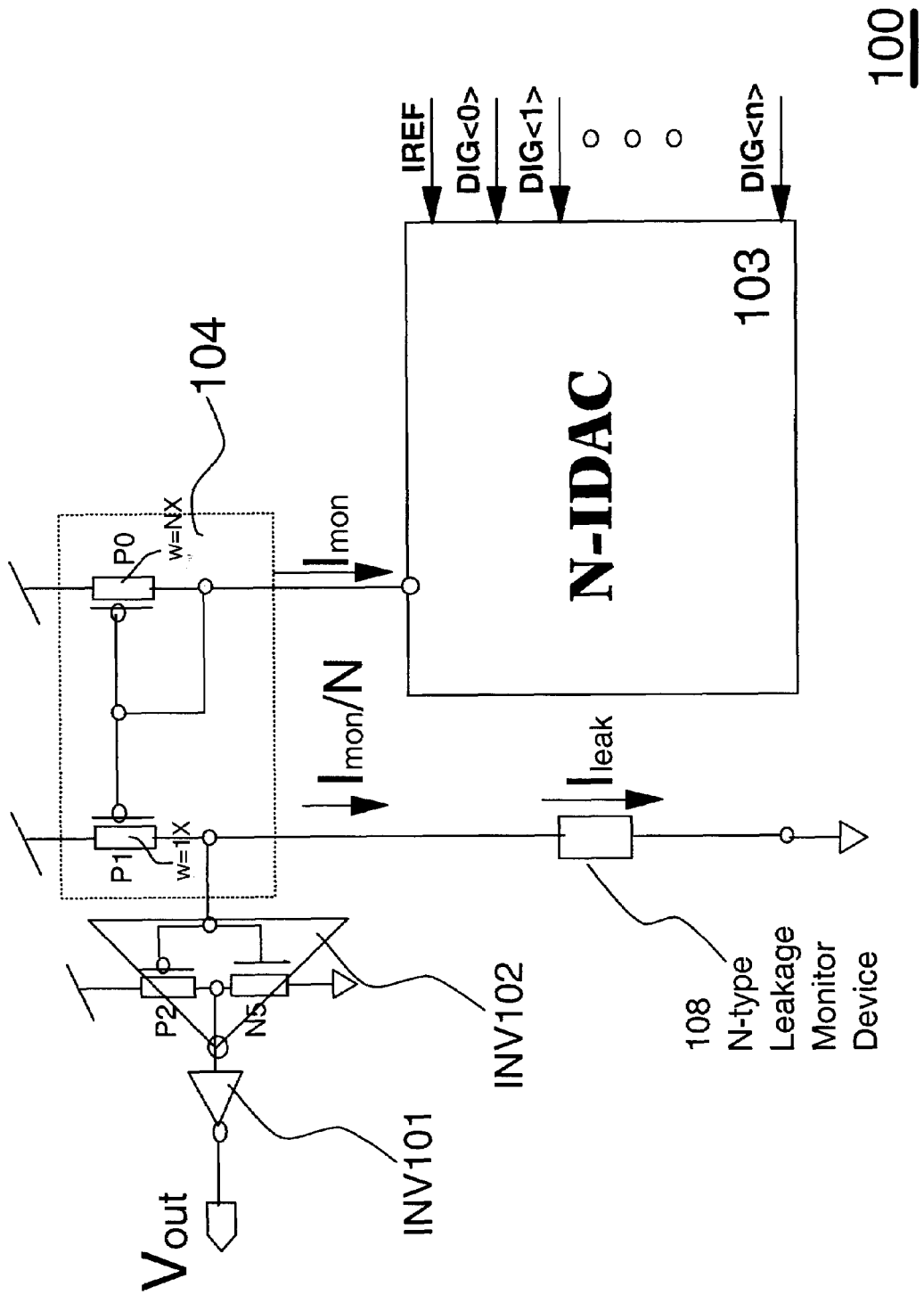

US 7,397,261 B2

MONITORING SYSTEM FOR DETECTING AND CHARACTERIZING CLASSES OF LEAKAGE IN CMOS DEVICES

BACKGROUND OF THE INVENTION

This invention generally relates to the manufacture of semiconductor devices, and more particularly, to a monitoring system for detecting and characterizing various classes of leakage in CMOS devices.

As the scaling of integrated circuit continues to progress, CMOS devices become prone to many different types of leakage problems. Current technology having a gate dielectric thinner than 10 nm, a channel length shorter than 50 nm, a junction depth thinner than 20 nm, the threshold voltage of fast devices below 200 mV are typically subject to serious leakage related problems.

Handling leakage problems has been profusely described in the art, as for instance, in U.S. Pat. No. 6,844,750 to Hsu et al. Therein is described a leakage monitoring apparatus that first measures die leakage and then generates digital keeper control bits to improve the performance of the dynamic circuits. More specifically, the sub-threshold leakage of CMOS devices on multiple locations of the die is simultaneously monitored. Based on the leakage information, keepers of dynamic circuits are properly sized to compensate for the leakage while maintaining the performance. The apparatus described uses a current mirror circuit to measure the sub-threshold leakage of pull down NMOS devices whose gates are connected to 150 mV. The patent is directed toward handling one specific class of circuit from being affected by sub-threshold leakage due to process variations. However, the apparatus described does not characterize other types of leakages, such as junction leakage, gate dielectric leakage. It neither addresses the problem of monitoring and quantifying the sub-threshold leakage of PMOS devices.

In another related patent, U.S. Pat. No. 6,844,771, issued to Chung-Hui Chen, there is described another class of leakage monitoring apparatus which first monitors the decoupling capacitor leakage voltage and selectively switches off any decoupling capacitor that displays a predetermined amount of leakage current. The apparatus detects the presence of gate dielectric leakage at a specific threshold level, i.e., when the leakage current multiplied by the gate resistance is smaller than ½ Vdd. When detected, a switch is triggered to shut off the capacitor. The proposed approach suffers from a serious problem, in that when the gate shows either a catastrophic failure or a broken gate oxide caused by pin-holes or other defects, the voltage drop exceeds a preset threshold level (e.g., ½ Vdd). As a result, the circuit fails to shut the decoupling capacitor off. Again, the cited patent is not suited for universal leakage characterization, since it makes no mention of how to measure other classes of leakage mechanisms other than capacitor leakage.

Gate Dielectric Leakage Characterization Circuit

As previously referred to, there are two classes of gate leakage: the first is known as normal leakage, while the second relates to the broken gate oxide leakage. The first class of leakage exhibits a weak temperature dependence and an activation energy value of approximately 0.4 eV. This value approximates the barrier height of the $SiO_2$ to Si interface. A normal gate oxide leakage current of this class, also known as thermal emission current, is described in the article by C. R. Crowell and S. M. Sze, "Current Transport in Metal-Semi-conductor Bafflers", Solid State Electron, 1966, Vol. 9, p. 1035-1048. The leakage level ranges from 1aA to 1pA. The second class is a gate oxide leakage mechanism, commonly referred to as Fowler-Nordheim tunnel, and it, likewise, displays a weak temperature dependence. The leakage level ranges from 1 to 10 pÅ. This second class of leakage is caused by broken gate oxide on different substrates, and is characterized by a leakage current level ranging from 0.1 to 1 mÅ.

The behavior of an n-MOS and p-MOS capacitor abnormal leakage significantly differs from one another. Therefore, it becomes necessary that they be independently monitored and characterized. In general, the broken gate leakage of a p-MOS capacitor is known to display a two to three orders of magnitude higher leakage current level than that of an n-MOS capacitor.

Referring now to FIGS. 1A and 1B, a schematic diagram and a device cross-sectional view of an n-MOS capacitor leakage monitoring device is illustrated. The gate is attached to node "B1", while the source, drain and body are connected to ground.

Referring to FIG. 2A and 2B, a schematic diagram and a device cross-sectional view of a PMOS capacitor leakage monitoring device are respectively shown. The gate is attached to node "B2", while the source/drain and body are connected to the power supply.

Sub-Threshold Leakage Characterization Circuit

The sub-threshold characteristics of a MOSFET device have strong temperature dependence, i.e., the lower the temperature, the lower the leakage current. The sub-threshold leakage current is conventionally measured at Vg=0V or at any lower bias level, typically, of the order of about 150 mV.

Referring to FIGS. 3A and 3B, there are shown a schematic diagram accompanied by a device cross-section of an NMOS sub-threshold leakage monitoring device. The gate is connected to ground or biased at 150 mV, while the drain is attached to node "A1" and the source and body to ground.

Correspondingly, FIGS. 4A and 4B show a schematic diagram and a cross-sectional view of a p-MOS sub-threshold leakage monitoring device. The gate is connected to VDD or biased at (VDD-150 mV). The drain is shorted to node "A2" while the source and body are connected to VDD.

Junction Leakage Characterization Circuit

The reserve leakage current for a normal p-n junction displays a strong temperature dependence which is governed by the relationship exp(–Eg/kT), wherein Eg is the band-gap energy of the order of 1.1 eV. However, for an abnormal p-n junction, the leakage level is two to five orders of magnitudes higher than that of a normal device. Its activation energy remains below 0.1 eV.

Referring to FIGS. 5A and 5B, a schematic diagram and a device cross-sectional view of an NMOS reverse p-n junction leakage monitoring device are shown. The gate is connected to node "C1", while the source, drain and body are attached to ground.

With reference to FIGS. 6A and 6B there are shown a schematic diagram and a device cross-sectional view of a p-MOS reverse p-n junction leakage monitoring device. The body is connected to node "C1", while the gate, source and drain are connected to VDD.

It is conceivable that a single p-type or n-type CMOS device or a plurality of CMOS devices can be advantageously used for monitoring. By way of example, if the leakage is proportional to the size (also referred to as the width) of the device, one may use as many devices as the area allocated thereto permits it.

In summary, while the prior art has addressed the problem of measuring the sub-threshold leakage and how to generate feedback controls to maintain keeper strength of dynamic circuits, there still remains a problem of how to monitor the effect of different classes of leakages, such as gate leakage, junction leakage and device leakage across a chip.

Furthermore, while the prior art has provided means for measuring leakage in n-type devices, it has not been able to expand this teaching to other classes of CMOS devices, regardless whether p-type or n-type.

Finally, and referring to monitor circuits capable of achieving the aforementioned goals, they typically require complex and bulky circuitry, each monitor device requiring its own comparator, which are difficult to integrate in a CMOS fabrication facility.

OBJECTS AND SUMMARY OF THE INVENTION

Accordingly, it is an object of the invention to provide an on-chip circuit capable of measuring and quantifying a plurality of classes of leakage in CMOS semiconductor devices.

It is another object to provide a universal circuit for characterizing leakage for both p-type and n-type CMOS devices.

It is a further object to characterize the gate dielectric leakage, junction leakage and sub-threshold leakage in CMOS devices.

It is still another object to provide a simple and small monitoring system that comprises a plurality of leakage sensors distributed across an integrated circuit chip.

It is yet a further object to provide a monitoring system that occupies less than 1% of the chip area, and which is preferably achieved by using only one comparator.

The invention provides a universal leakage monitoring system, hereinafter referred to as ULMS, to measure each leakage class during process development and/or normal operation period. The ULMS of the present invention is able to characterize CMOS devices on: (1) the gate dielectric leakage through the thin gate dielectric, (2) the sub-threshold leakage through a very short channel region even when the gate is completely turned off, (3) the reverse biased junction leakage, and the like. The ULMS further is advantageously used to qualify the fabrication process, devices and circuits by investigating, for instance, the gate leakage while using a new gate dielectric; junction leakage while using a raised source-drain structure; and sub-threshold leakage while providing ultra-low threshold voltage CMOS devices.

The present invention further provides a system for monitoring a plurality of classes of leakages in an integrated circuit, the circuit including: a) a plurality of monitoring macros, each of the monitoring cells detecting one class of the leakages; b) a set of measuring macros respectively measuring one class of the leakages to generate respective leakage data; c) a set of data collecting devices, collecting the leakage data: and a scan chain to scan leakage data out when the measuring is completed.

BRIEF DESCRIPTION OF THE DRAWINGS

The accompanying drawings, which are incorporated in and which constitute part of the specification, illustrate the presently preferred embodiments of the invention which, together with the general description given above and the detailed description of the preferred embodiments given below serve to explain the principles of the invention.

FIGS. 3A-3B show respectively a schematic diagram and a cross-sectional view of a prior art n-MOS sub-threshold leakage monitoring device.

FIGS. 4A-4B show respectively a schematic diagram and a cross-sectional view of a prior art p-MOS sub-threshold leakage monitoring device.

FIG. 7A shows a schematic diagram of an n-type MOS device leakage monitoring circuit according to the invention.

DETAILED DESCRIPTION

Hereinafter will be described the n-MOS and p-MOS leakage monitoring apparatus of the present invention. Since the circuit conFIGurations for testing n-MOS and p-MOS differ significantly from each other, they will be described independently.

N-MOS Leakage Measuring Apparatus

Figure 1A:
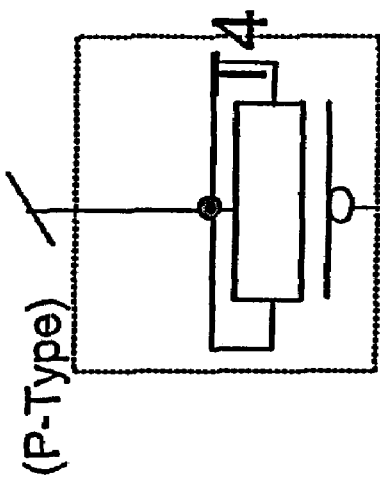
FIGS. 1A-1B show respectively a schematic diagram and device cross-section of a conventional n-MOS capacitor monitor device.
Figure 1B:
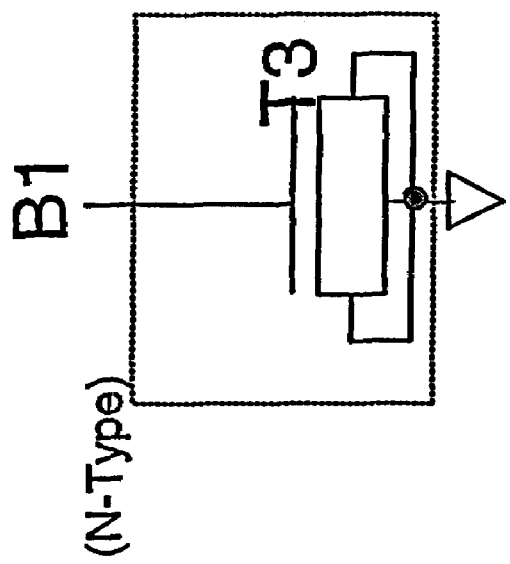
Figure 5A:
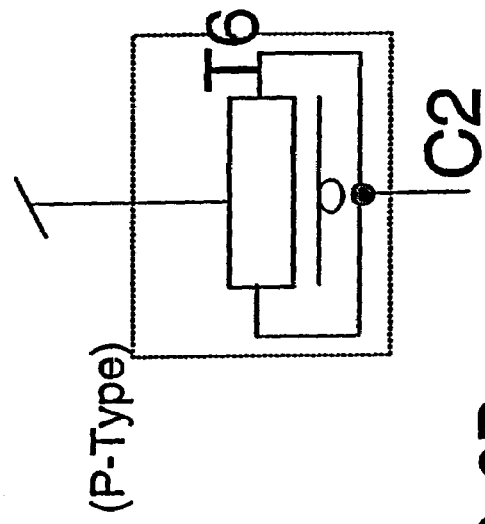
FIGS. 5A-5B show respectively a schematic diagram and a cross-sectional view of a prior art n-MOS reverse p-n junction leakage monitoring device.
Figure 5B:
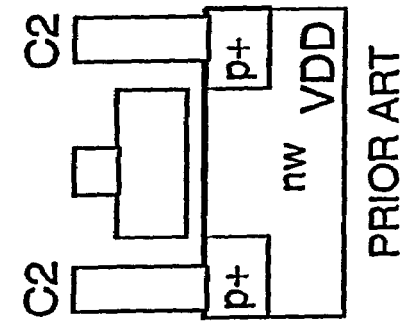

As previously stated, leakage monitoring devices of the class shown with reference to the circuits illustrated in FIGS. 1, 3 and 5, only one class of leakage, whether testing the gate, sub-threshold and junction leakage, respectively, can be tested at one time. The circuit is designed to test both normal and abnormal types of leakage for any classes of CMOS devices, which differ from each other by several orders of magnitude.

Regarding the present invention, and with reference to FIG. 7A, the digital bits DIG<0>, DIG<1> . . . DIG<n> are used to size the reference current for sensing the leakage current. A binary decoding technique is, preferably, used to achieve high resolution when taking measurements.

The total monitoring current "Imon" is generated as follows: the monitor current level is to coincide with the highest reachable leakage level, e.g., 1 mA. This level can be downsized by way of a mirror device positioned between P0 and P1. If the size of P0 is N multiplied by the size of P1, (i.e, N=size P0/size P1), the mirrored current to P1 becomes Imon/N. In order to achieve a reduction of the order of several orders of magnitude, more than one mirror stage (not shown) becomes necessary. If the leakage current Ileak drawn by the leakage monitor device is greater than Imon/N, the node voltage at the input of the inverter formed by P2 and N5 will decrease to ground, and the output of the sensor will remain at "low". One may then increase the digital setting to raise the value of Imonl until Imon/N >Ileak, while the output remains at high. The leakage level is measured as the ratio Imon/N. For monitoring different leakage mechanisms, a different size ratio N is selected to achieve an effective sensing.

Figure 2A:
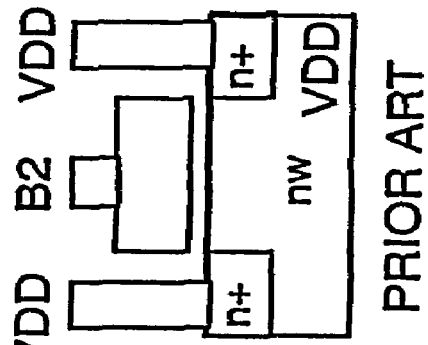
FIGS. 2A-2B show respectively a schematic diagram and a cross-sectional view of a prior art p-MOS capacitor leakage monitoring device.
Figure 2B:
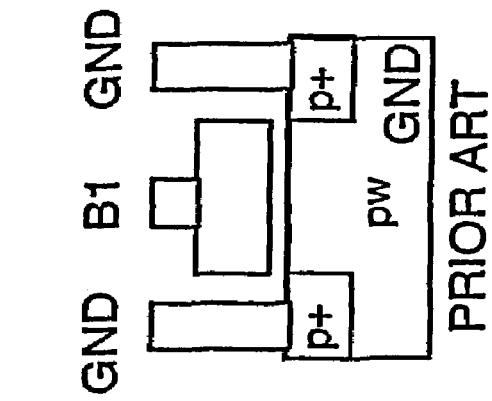
Figure 6A:
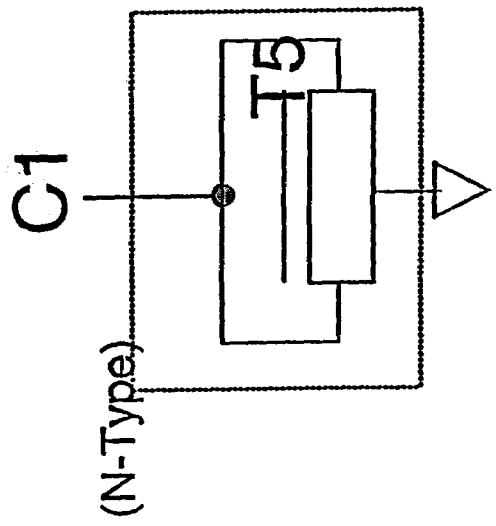
FIGS. 6A-6B show respectively a schematic diagram and a cross-sectional view of a prior art p-MOS reverse p-n junction leakage monitoring device.
Figure 6B:
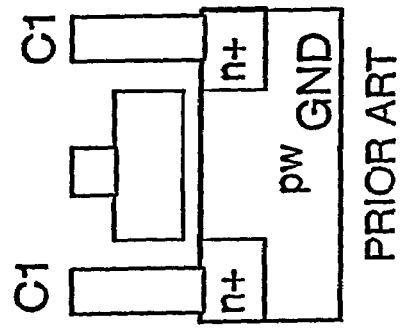

When measuring p-MOS leakage, a different class of leakage monitoring device becomes necessary, namely, one that is better adapted to handle p-type leakage, as previously described with reference to FIGS. 2, 4, and 6 in which case, a p-type binary decoder is used to tune Imon. The ratio of the size of the n-MOS devices N0 to N1 determines the ratio N of the leakage measurement. When Imon/N>Ileak, then Vout switches to high, and the leakage current is measured.

Referring to FIG. 7A depicting a schematic diagram of an n-type leakage measuring device 100, there is also shown a circuit formed by an n-type IDAC 103 (current controlled current digital to analog converter), a current mirror circuit 104, two output inverters, INV101 and INV102, and an n-type leakage monitoring device 108. The n-type leakage monitor circuit further includes three classes of monitoring structures to measure various types of leakage, preferably including gate, junction and sub-threshold leakages. The current mirror circuit 104 mirrors the monitor current Imon from diode P0 to P1 having a width ratio N. More particularly, Imon/N is mirrored to probe the leakage current Ileak. If Imon/N>Ileak, then the input node voltage at the output inverter INV102 will rise to power supply level and subsequently force a low at the output of inverter 102. Moreover, the output Vout of the second inverter INV101 remains at high. However, when adjusting IDAC 103 until Imon/N>Ileak, the output voltage Vout remains at low. Thus, the n-type leakage current is measured digitally. The detailed measuring technique will be explained hereinafter. Leakage levels are sampled using digital bits DIG<i>. Generally, DIG<l>. ... DIG<n> are preferably generated locally within the n-type leakage device 100 (as will be further described with reference to FIG. 10) via a preset algorithm or a state machine to sample the leakage current of each monitor.

Figure 7B:
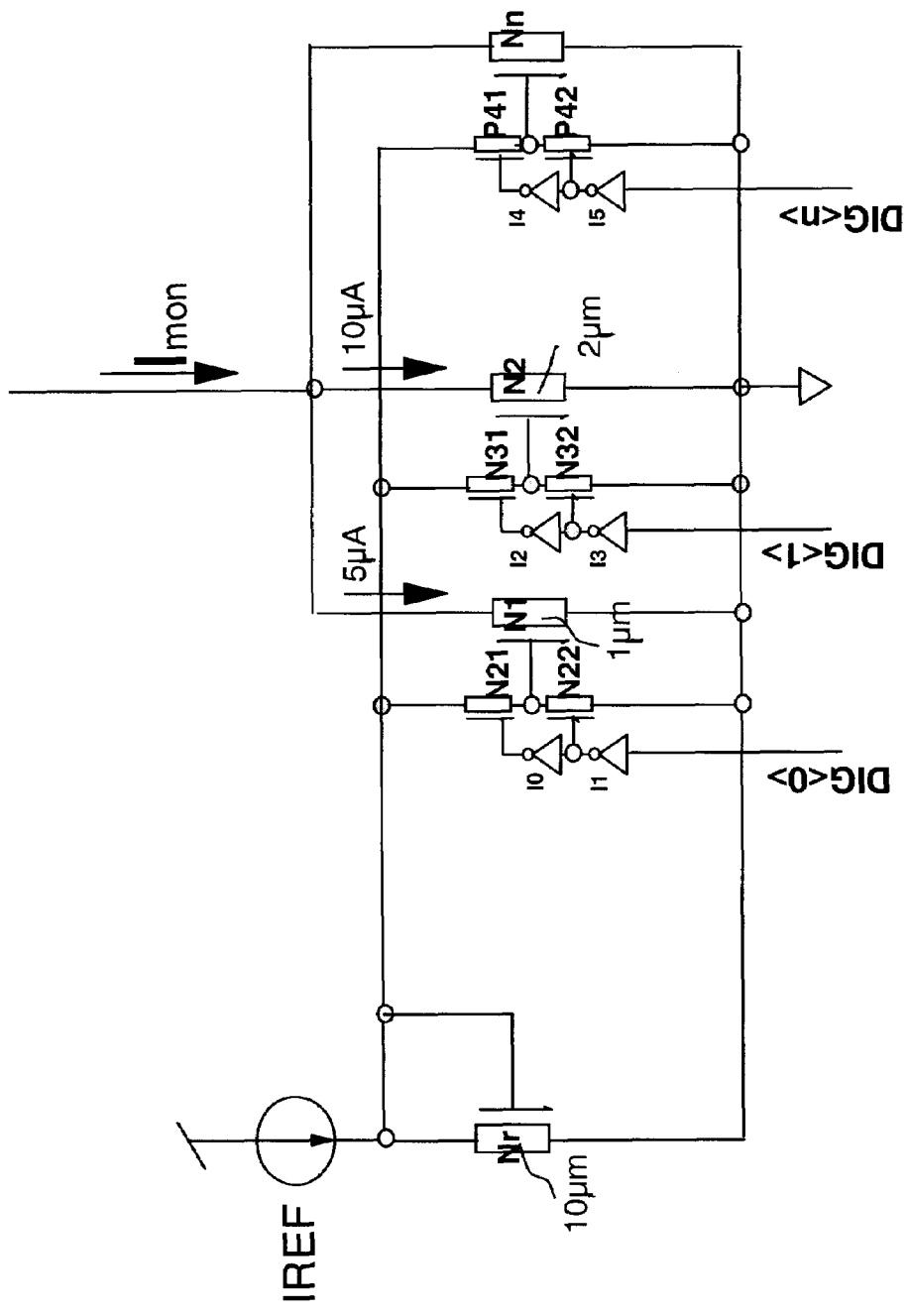
FIG. 7B illustrates a schematic diagram of an n-type MOS current controlled current digital to analog converter (IDAC), according to the present invention.

Referring to FIG. 7B, there is shown a schematic diagram of an n-type IDAC 103. The DAC receives a reference current Iref, (e.g., 50 µÅ ), which is mirrored from Nr to Ni (where I=1, 2 ..., n). If the size of Nr=10 µm and Ni is configured in binary form, e.g., if the width of N1 is 1 µm, then the width of N2 is multiplied by 2 (i.e., 4 µm), and N3 multiplied by 4 (i.e., 8 µm), etc. When N1 is activated by asserting a first digital vector, or when DIG<0>=1, the output of inverter I1 will be at low and the output of inverter I0 will stand at high, which in turn switches n-MOS device N21 on and n-MOS N22 off. At this instant, the gate of N1 becomes connected to the gate of the mirror device Nr. The current mirrored from Nr to N1 will be 50 µÅ (¹⁄₁₀)=5 µÅ. Similarly, if DIG<1>=1 while is at 0, the current that mirrors Nr to N2 will be 10 µÅ , and the like. The binary setting allows Imon to vary from 5 µÅ to 80 µÅ when 4-bit vectors are used. That is, when DIG<0:3>=<1,1,1,1>, then Imon=80 µÅ. This technique as described enables the leakage current of the n-type leakage devices to be digitized.

Figure 8A:
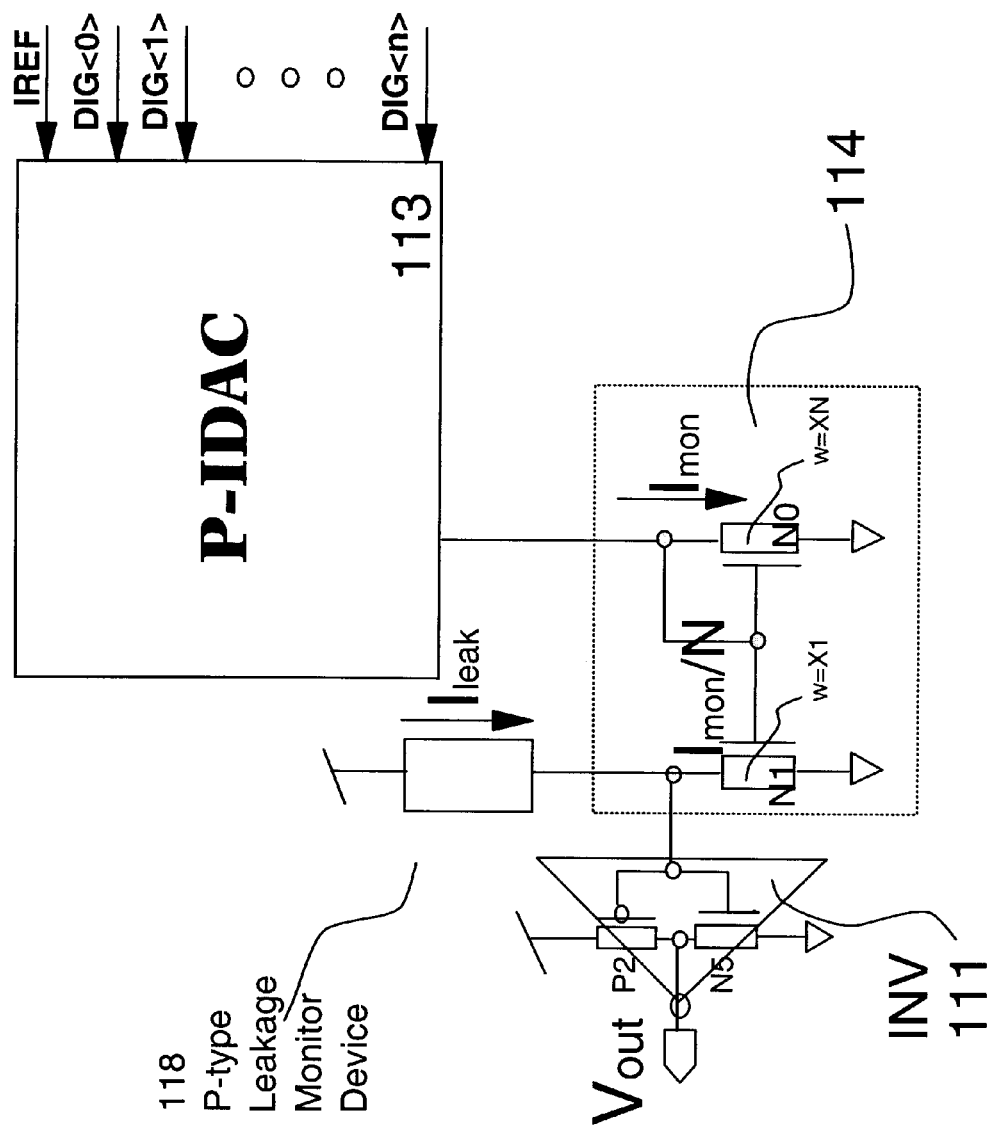
FIGS. 8A-8B respectively show a schematic diagram of a p-type MOS device leakage monitoring circuit and corresponding IDAC incorporated therein, in accordance with the invention.

Referring to FIG. 8A, there is shown a schematic diagram 110 for measuring a p-type leakage device. It is formed by p-type IDAC 113 (current controlled current digital to analog converter), a current mirror circuit 114, an output inverter INV 111, and a p-type leakage monitor device 118. The p-type leakage monitor device further includes three different classes of monitor devices to detect among others, gate, junction and sub-threshold leakages. The current mirror circuit 114 mirrors the monitor current Imon from a diode device comprised of N0 to N1 and having a width ratio of N. In other words, Imon/N is mirrored in order to probe the leakage current Ileak. If Imon/N>Ileak, then the input node voltage of output inverter INV102 decreases to 0, subsequently setting Vout at high at the output of the inverter. However, when adjusting IDAC 113 until Imon/N is smaller than Ileak, the output voltage Vout will stand at low and the P-type leakage current may then be measured digitally. The measuring technique will be explained in more detail hereinafter.

Figure 8B:
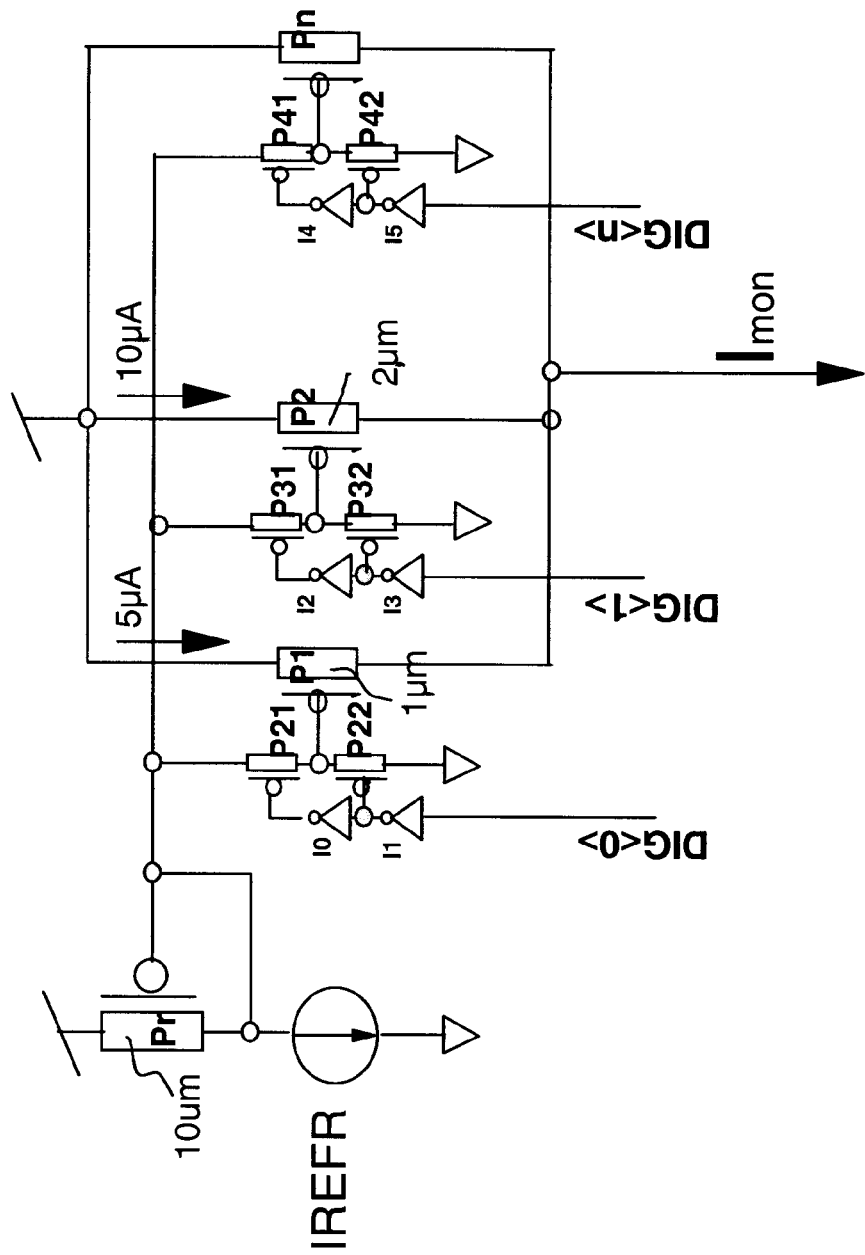

Referring to FIG. 8B, there is shown a schematic diagram of an n-type IDAC 113. It receives a reference current Iref, (in the present example, 50 µÅ), which is mirrored from Pr to Pi (where i=1,2, ... n). If the width of Pr=10 µm, and the width of Pi is in binary format, e.g., if the width of P1=µm,the width of P2 will then be twice the width of P1, and P3 will be four times, and so on. When P1 is activated by asserting the first digital vector, or when DIG<0>=1, the output of the inverter I1 will be at low, and the output of the inverter I0 switch will be at high, which in turn switches the p-MOS device P21 on and the p-MOS device P22 off, connecting the gate of P1 to the gate of mirror device Pr. The current mirrored from Pr to P1 is of the order of 50 µÅ (¹⁄₁₀)=5 µÅ. Similarly, if DIG<1>=1 while the remaining are 0, the current mirrors from Pr to P2 will be 10 uÅ, and the like. The binary setting makes it possible for Imon to vary from 5 µÅ to 80 µÅ when 4-bit vectors are used, i.e., when DIG<0:3>=<1,1,1,1> and Imon=80 µÅ. By way of this technique, the leakage current level of the p-type leakage devices can be digitized.

Figure 9:
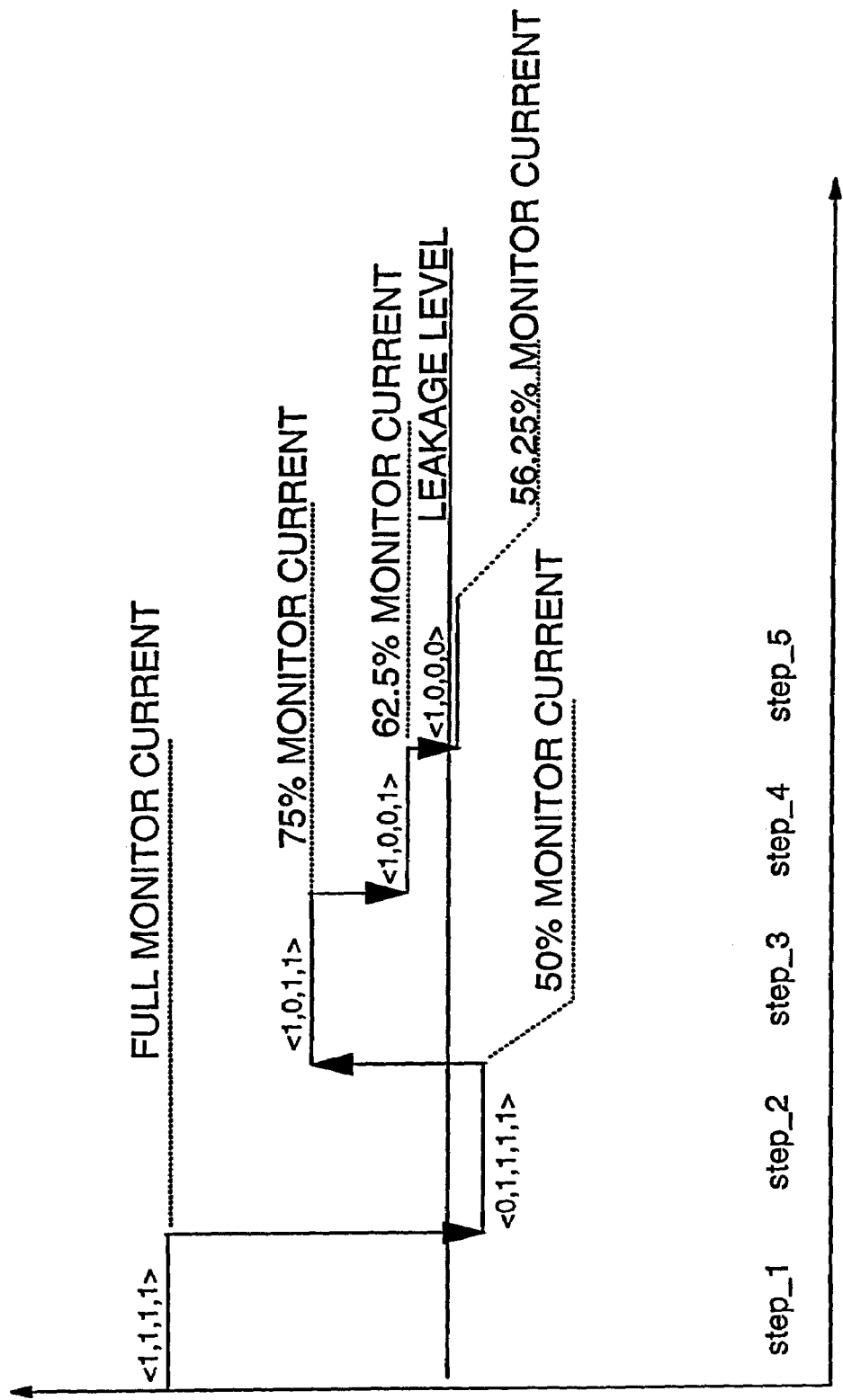
FIG. 9 illustrates a built-in algorithm to perform a binary search to determine the presence of leakage of any source, and more particularly, to perform a binary search for sets of digital bits while probing the leakage current (Ileak).

Referring to FIG. 9, there is shown a technique for executing a binary search to set the digital bits while probing the leakage device. A built-in algorithm is used to probe the leakage current Ileak. At the start, if all the 4-bit vectors (i.e., starting with <0,0,0,0>; then <0,0,0,1>; and the like up to <1,1,1,1>) are set to high, <1,1,1,1> and Imon>Ileak, the output voltage Vout remains at high. In step 2. Imon is lowered by 50%, which sets the vectors to <0,1,1,1>, with the most significant bit set to 0. Vout is at low, and since Imon <Ileak, then Imon must increase by 25%, which is equivalent to setting the vectors to <1,0,1,1>, while Vout remains at low, which indicates that Imon>Ileak. The third step is to reduce current by 12.5%, or setting the vectors to <1,0,0,1> which results in Vout remaining at low. The final step is to further reduce Imon by 6.25%, or setting the vectors to <1,0,0,0>, since all the bits have been used, and the measured Ileak approximates the value of Imon. However, if 4-bit vectors are not sufficient, preferably, one can provide additional bits to obtain better results.

Still referring to FIG. 9, by sizing the width of Ni, the adjacent path will flow twice the current of the existing path. For example, if the target is 7.3, the search range is 10. Then, the first step starts with 5 (mid-point of 10), and since 5 is less than 7.3, in the next step, it goes up half-way between 5 and 10, i.e., 7.5. However, since 7.5 is greater than 7.3, it is lowered down half-way between 7.5 and 5, i.e., 7.25 and the like, until the final result is sufficiently close to the target. Having described the operating steps in FIG. 9, the algorithm can be expressed in hardware, by way of a circuit design (not shown) or, alternatively, it can take the form of a state-machine (not shown). Practitioners of the art will readily realize that binary search is a known algorithm, and therefore, no further description will be provided.

The circuits respectively shown in FIGS. 7B and 8B are designed to perform a binary search.

Figure 10:
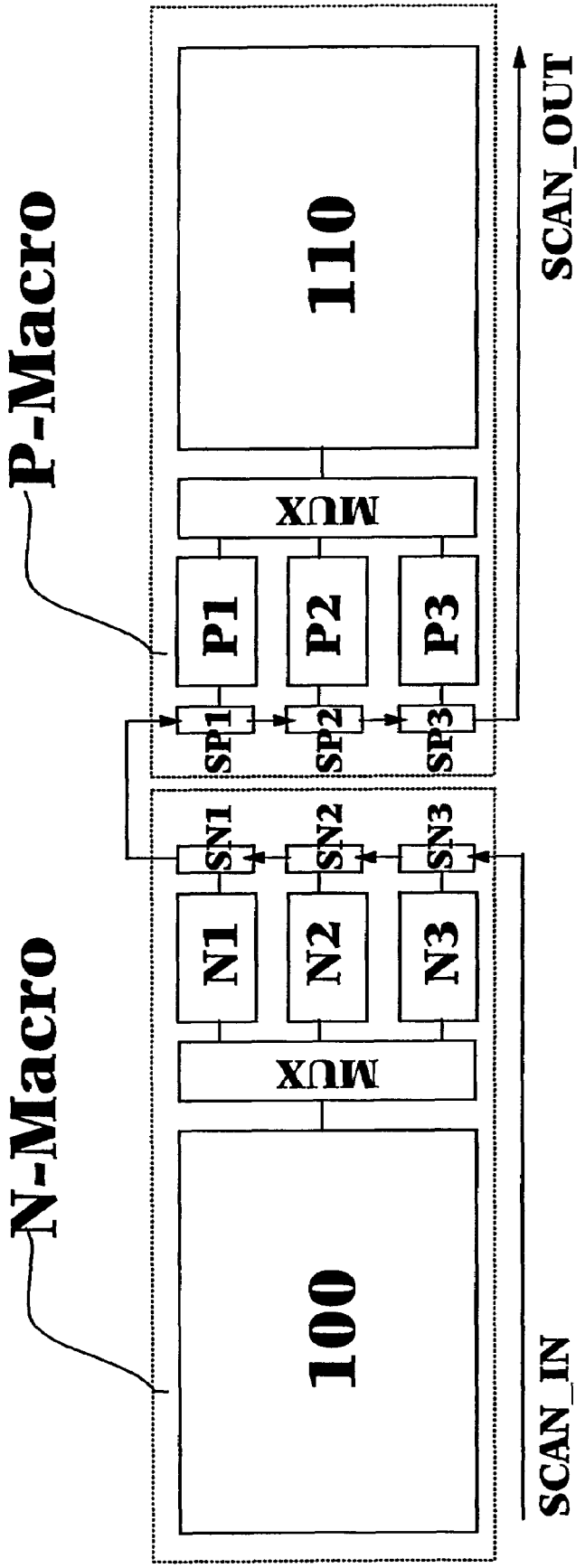
FIG. 10 shows a combination test site that includes an n-type test macro and a p-type test macro.

Referring now to FIG. 10, there is shown a test site formed by a combination of an n-type and a p-type test macro. Each test macro preferably includes a test circuit 100, a multiplexer, three leakage classes test of monitors N1 to N3 and P1 to P3 and corresponding three register groups SN1 to SN3 and SP1 to SP3. During testing, the test controller (not shown)

selects the first class of test monitor to be connected to the test circuit via a multiplexer for measuring the first class of leakage. When completed, the final digital vectors representing the first class leakage level are stored in corresponding register groups. The test controller selects the second class of test monitor, and the like. When all the leakage information is collected, the data is scanned out sequentially.

Figure 11:
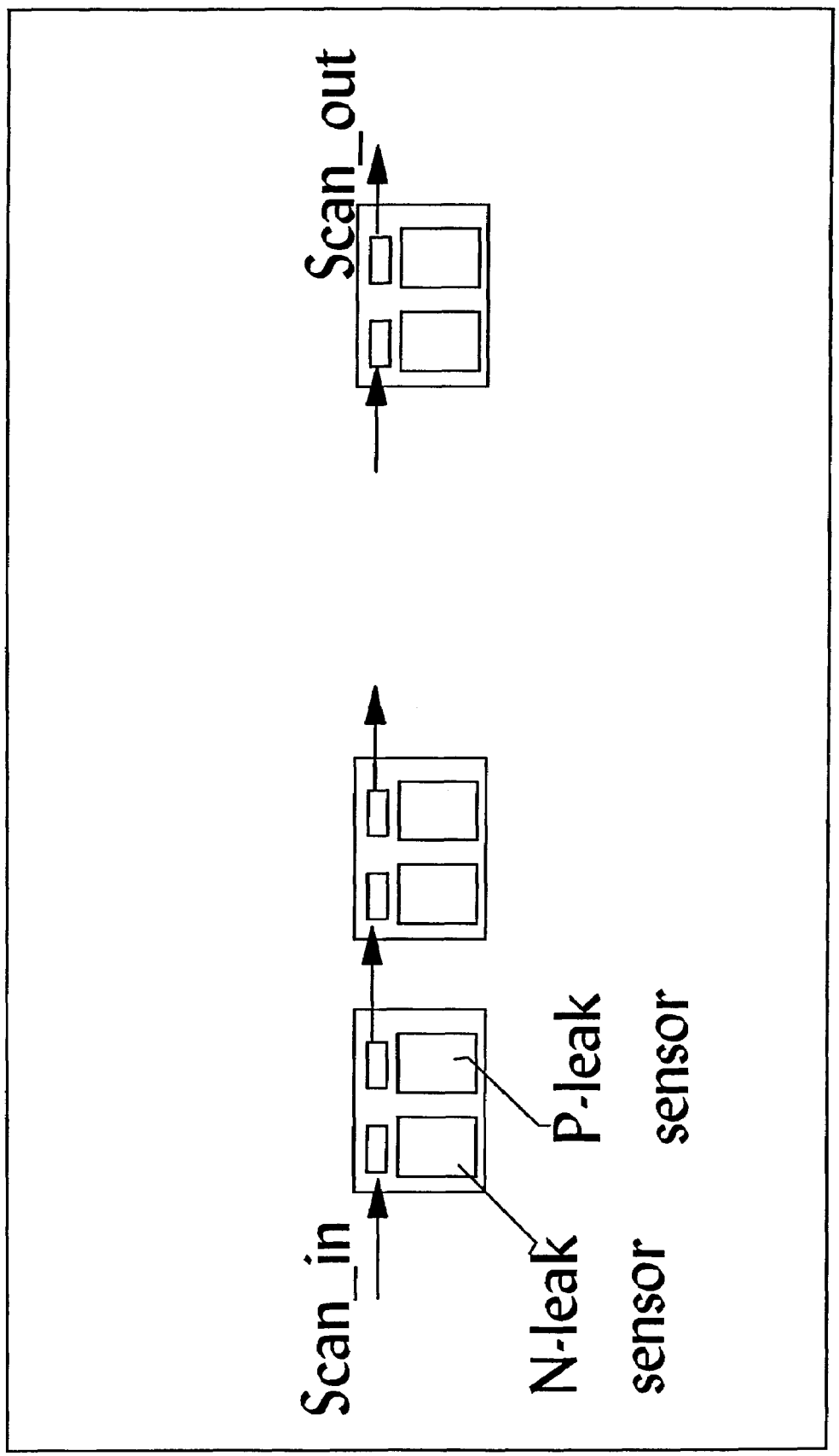
FIG. 11 is a top level representation of a test system which includes a plurality of test units, as shown in FIG. 10.

Referring to FIG. 11, there is shown a high level view of the test system formed by a plurality of the test units shown in FIG. 10. Each unit is placed strategically throughout the chip and linked by way of a scan chain to facilitate the collection of leakage information. The size of each leakage monitor is designed to properly recognize any statistical significances. Herein, the recommended size ranges from 50 $\mu m^2$ to 1000 $\mu m^2$.

Figure 12:
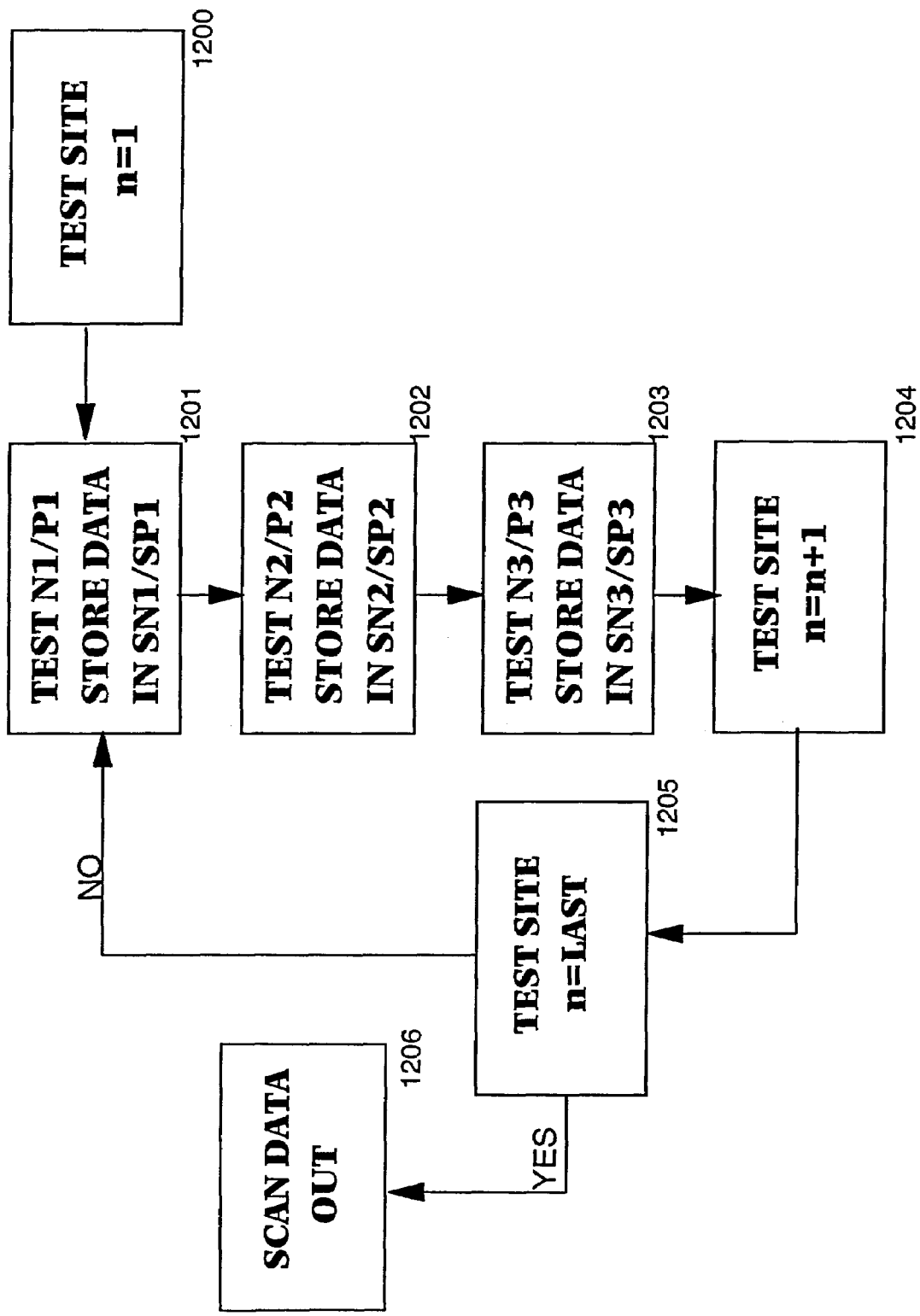
FIG. 12 is a flow chart diagram of a preferred measurement technique wherein testing is performed sequentially from the first test site to the last test site using the on-chip algorithm shown in FIG. 9.

Referring now to FIG. 12, there is shown a flowchart of the preferred measurement technique according to the invention. In this case, testing is performed sequentially from the first test site up to the last test site using an on-chip algorithm. It starts with test site 1 (step 1200), simultaneously testing N1 and P1 and feeding the test result to register group SN1 and SP1, respectively (step 1201). It then tests N2 and P2 (1202) and so on, until the first site is completed (1203), and then moves to the second test site (1204). When the last test site is tested (1205), it scans the data out (step 1206).

While the present invention has been particularly described in conjunction with a specific preferred embodiment, it is evident that many alternatives, modifications and variations will be apparent to those skilled in the art in light of the present description. For instance, in addition to the classes of leakages that were described and handled in the present invention, other classes may be considered and handled with equal success. It is therefore contemplated that the appended claims will embrace any such alternatives, modifications and variations as falling within the true scope and spirit of the present invention.

What is claimed is:

1. A circuit for characterizing a plurality of classes of leakages in a CMOS integrated circuit, the circuit comprising:
   a plurality of monitoring cells, each of said monitoring cells detecting one class of said leakages;
   a plurality of sensors, each of said sensors respectively measuring said one class of said leakages to generate respective leakage data; and
   a plurality of data collecting devices, respectively collecting said measured classes of leakage data.

2. The circuit as recited in claim 1, wherein said class of leakages is selected from a group consisting of gate leakage, junction leakage, and sub-threshold leakage across chips forming said CMOS integrated circuit.

3. The circuit as recited in claim 1, wherein said monitoring cells are comprised of n-type and p-type macros.

4. The circuit as recited in claim 3 wherein each of said monitoring cells having said n-type macro comprises:
   an n-type current controlled digital to analog converter;
   a current mirror circuit; and
   an n-type leakage monitoring device.

5. The circuit as recited in claim 3 wherein each of said monitoring cells having said p-type macro comprises:
   an p-type current controlled digital to analog converter;
   a current mirror circuit; and
   a p-type leakage monitoring device.

6. The circuit as recited in claim 4, wherein each of said n-type leakage monitor devices monitors detect one of said classes of said n-type leakages.

7. The circuit as recited in claim 5, wherein each of said p-type leakage monitor devices monitors detect one of said classes of said p-type leakages.

8. The circuit as recited in claim 4, wherein said leakage current (Ileak) is measured digitally.

9. The circuit as recited in claim 6, further comprising means coupled to said monitoring devices executing a binary search to set digital bits representing said leakage data.

10. The circuit as recited in claim 7 further comprising a built-in algorithm for sequentially collecting respective classes of leakage of respective types of devices from a plurality of said sensors.

11. A method for characterizing a plurality of classes of leakages in a CMOS integrated circuit, the method comprising:
   integrating monitoring cells in said CMOS integrated circuit, each of said monitoring cells detecting one class of said leakages;
   providing sensing devices respectively measuring one class of said leakages to generate respective leakage data; and
   providing data collecting devices, collecting said measured classes of said leakage data.

12. The method as recited in claim 11, wherein said class of leakages is selected from a group consisting of gate leakage, junction leakage, and sub-threshold leakage across chips forming said integrated circuit.

13. The method as recited in claim 11, wherein said monitoring cells are comprised of n-type and p-type macros.

14. The method as recited in claim 13 wherein said n-type macros are respectively comprised of:
   an n-type current controlled current digital to analog converter;
   a current mirror circuit; and
   an n-type leakage monitoring device.

15. The method as recited in claim 13 wherein said p-type macros are respectively comprised of:
   an p-type current controlled current digital to analog converter;
   a current mirror circuit; and
   a p-type leakage monitoring device.

16. The method as recited in claim 14, wherein each of said n-type leakage monitoring cells respectively detects one of said classes of said n-type leakages.

17. The method as recited in claim 15, wherein each of said p-type leakage monitoring cells respectively monitors one of said classes of said p-type leakages.

18. The method as recited in claim 14, wherein said leakage current (Ileak) is measured digitally.

* * * * *